United States Patent
Kang et al.

(10) Patent No.: US 12,512,049 B2
(45) Date of Patent: Dec. 30, 2025

(54) DISPLAY DEVICE AND ELECTRONIC DEVICE

(71) Applicant: Samsung Display Co., Ltd., Yongin-si (KR)

(72) Inventors: Kwanghun Kang, Yongin-si (KR); Yanguk Nam, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/909,073

(22) Filed: Oct. 8, 2024

(65) Prior Publication Data

US 2025/0148970 A1 May 8, 2025

(30) Foreign Application Priority Data

Nov. 2, 2023 (KR) .................. 10-2023-0150040

(51) Int. Cl.
*G09G 3/3208* (2016.01)
*H10K 59/95* (2023.01)

(52) U.S. Cl.
CPC ..... *G09G 3/3208* (2013.01); *G09G 2330/021* (2013.01); *H10K 59/95* (2023.02)

(58) Field of Classification Search
CPC ........... G09G 3/3208; G09G 2330/021; G09G 3/2096; G09G 2300/0408; G09G 2330/028; H10K 59/95; H02M 1/0009; H02M 1/0025; H02M 3/156
See application file for complete search history.

(56) References Cited

U.S. PATENT DOCUMENTS

| | | |
|---|---|---|
| 10,431,147 B2 | 10/2019 | Park |
| 11,881,150 B2 | 1/2024 | Nam et al. |
| 2018/0233078 A1* | 8/2018 | Park .................. G09G 3/20 |
| 2023/0237952 A1* | 7/2023 | Nam .................. H02M 1/0025 |
| | | 345/212 |

FOREIGN PATENT DOCUMENTS

| | | |
|---|---|---|
| KR | 1020180094206 A | 8/2018 |
| KR | 1020230114805 A | 8/2023 |

* cited by examiner

*Primary Examiner* — Chanh D Nguyen
*Assistant Examiner* — Gloryvid Figueroa-Gibson
(74) *Attorney, Agent, or Firm* — CANTOR COLBURN LLP

(57) ABSTRACT

A display device includes a power managing circuit which generates a display driving voltage, a display driving circuit which receives the display driving voltage, and a display panel to display an image. The power managing circuit includes a converting circuit which converts the input voltage into the display driving voltage, and outputs the display driving voltage through an output terminal, a load sensing circuit connected to the converting circuit to sense a load current of the output terminal and which outputs a sensing result signal, a resistance dividing circuit connected to a feedback terminal to receive a feedback voltage, and which controls a level of the feedback voltage in response to a feedback control signal, and a control circuit which controls an operation of the converting circuit by providing the feedback control signal to the resistance dividing circuit based on the sensing result signal.

20 Claims, 10 Drawing Sheets

DISPLAY DEVICE AND ELECTRONIC DEVICE

This application claims priority to Korean Patent Application No. 10-2023-0150040, filed on Nov. 2, 2023, and all the benefits accruing therefrom under 35 U.S.C. § 119, the content of which in its entirety is herein incorporated by reference.

BACKGROUND

Embodiments of the disclosure described herein relate to a display device and an electronic device, and more particularly, relate to a display device and an electronic device, which have a function for compensating for power loss.

An emissive display device among various types of display device displays an image by using a light emitting diode that generates light through the recombination of electrons and holes. The emissive display device typically has a rapid response speed and is driven with lower power consumption.

The emissive display device may include pixels connected to data lines and scan lines. Each of the pixels typically includes a light emitting element and a pixel circuit unit to control the quantity of current flowing through the light emitting element. In response to a data signal, the pixel circuit unit controls the amount of current that flows from a first driving voltage to a second driving voltage via the light emitting diode. In this case, light having specific brightness is generated to correspond to the quantity of current flowing through the light emitting element.

SUMMARY

Embodiments of the disclosure provide a display device and an electronic device for stably supplying power by compensating for power loss.

According to an embodiment of the disclosure, a display device includes a power managing circuit which receives an input voltage to generate a display driving voltage, a display driving circuit which receives the display driving voltage to output a panel control signal, and a display panel which receives the panel control signal to display an image.

In such an embodiment, the power managing circuit includes a converting circuit which converts the input voltage into the display driving voltage, and outputs the display driving voltage through an output terminal, a load sensing circuit connected to the converting circuit, where the load sensing circuit senses a load current of the output terminal and outputs a sensing result signal, a resistance dividing circuit connected to a feedback terminal to receive a feedback voltage, where the resistance devising circuit controls a level of the feedback voltage in response to a feedback control signal, and a control circuit which controls an operation of the converting circuit by providing the feedback control signal to the resistance dividing circuit based on the sensing result signal.

According to an embodiment of the disclosure, a display device includes a power managing circuit which receives an input voltage to generate a display driving voltage, a display driving circuit which receives the display driving voltage and output a panel control signal, and a display panel which receives the panel control signal to display an image.

In such an embodiment, the power managing circuit includes a converting circuit which converts the input voltage into the display driving voltage, in response to a pulse width modulation signal generated based on converting information and outputs the display driving voltage through an output terminal, a load sensing circuit connected to the converting circuit, where the load sensing circuit senses a load current of the output terminal and outputs a sensing result signal, and a control circuit which provides the pulse width modulation signal to the converting circuit and changes the converting information based on the sensing result signal.

According to an embodiment of the disclosure, an electronic device includes a power managing circuit which receives an input voltage to generate a display driving voltage, a display driving circuit which receives the display driving voltage and an image signal and outputs a panel control signal, a display panel which receives the panel control signal to display an image, and a main processor which provides the image signal to the display driving circuit.

In such an embodiment, the power managing circuit includes a converting circuit which converts the input voltage into the display driving voltage, and outputs the display driving voltage through an output terminal, a load sensing circuit connected to the converting circuit, where the load sensing circuit senses a load current of the output terminal and outputs a sensing result signal, a resistance dividing circuit connected to a feedback terminal to receive a feedback voltage, where the resistance dividing circuit controls a level of the feedback voltage in response to a feedback control signal, and a control circuit which controls an operation of the converting circuit by providing the feedback control signal to the resistance dividing circuit based on the sensing result signal.

BRIEF DESCRIPTION OF THE DRAWINGS

The above and other features of embodiments of the disclosure will become apparent by describing in detail embodiments thereof with reference to the accompanying drawings.

DETAILED DESCRIPTION

Figure 1:
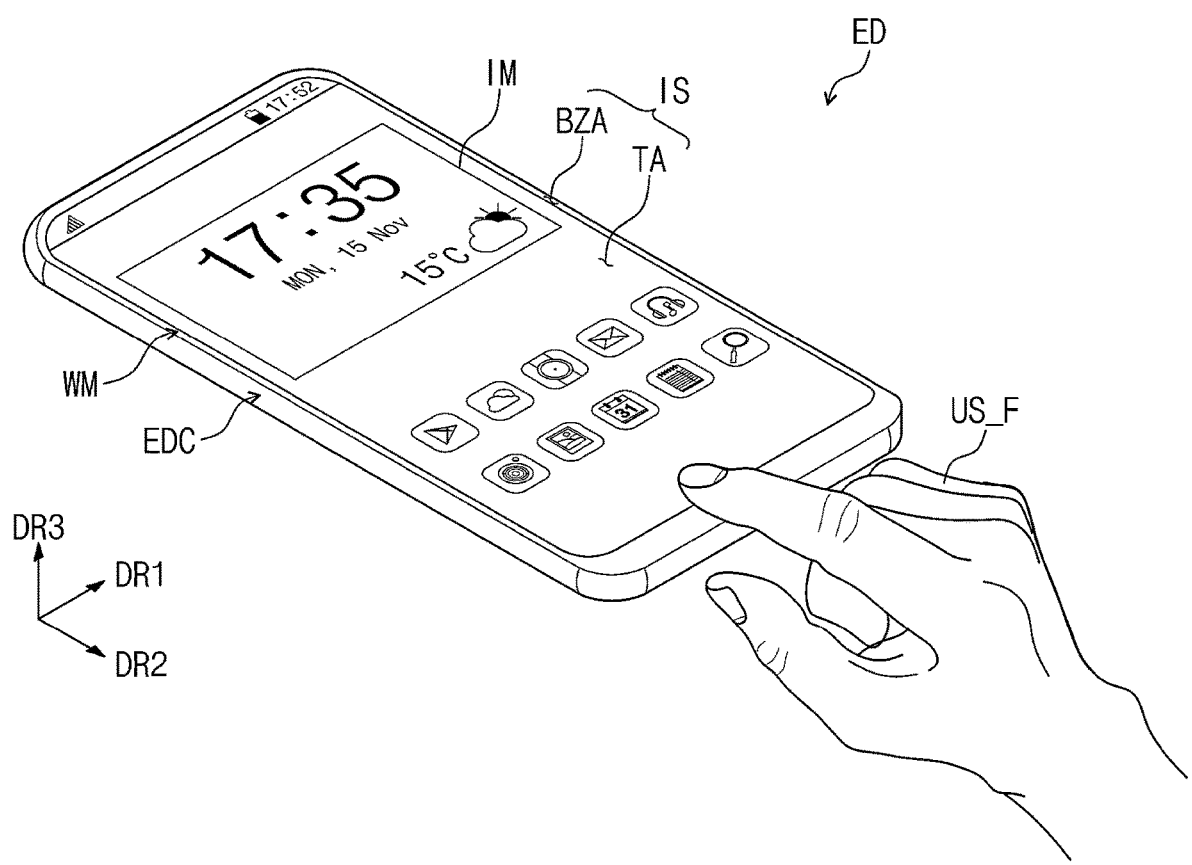
FIG. 1 is a perspective view of an electronic device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the specification, the expression that a first component (or region, layer, part, portion, etc.) is "on", "connected to", or "coupled to" a second component means that the first component is directly on, connected to, or coupled to the second component or means that a third component is interposed therebetween.

The same reference numeral will be assigned to the same component. In addition, in drawings, thicknesses, proportions, and dimensions of components may be exaggerated to describe the technical features effectively.

Although the terms "first", "second", etc. may be used to describe various components, the components should not be construed as being limited by the terms. The terms are only used to distinguish one component from another component. For example, without departing from the scope and spirit of the invention, a first component may be referred to as a second component, and similarly, the second component may be referred to as the first component.

In addition, the terms "under", "at a lower portion", "over", "an upper portion" are used to describe the relationship between components illustrated in drawings. The terms are relative and are described with reference to a direction indicated in the drawing.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises", "comprising", "includes", "including" or "having" specify the presence of stated features, numbers, steps, operations, components, parts, or the combination thereof, but do not preclude the presence or addition of one or more other features, numbers, steps, operations, components, components, and/or the combination thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical terms and scientific terms) used in the specification have the same meaning as commonly understood by one skilled in the art to which the disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described with reference to accompanying drawings.

FIG. 1 is a perspective view of an electronic device according to an embodiment of the disclosure.

Referring to FIG. 1, according to an embodiment of the disclosure, an electronic device ED may have a shape of a rectangle having a shorter side parallel to a first direction DR1 and a longer side parallel to a second direction DR2 crossing the first direction DR1. However, an embodiment is not limited thereto, and the electronic device ED may have various shapes such as a circle or a polygon.

The electronic device ED may be a device activated in response to an electrical signal. The electronic device ED may include various types of device. For example, the electronic device ED may be an electronic device including a display screen, such as a personal computer (PC), a smartphone, a smart watch, a tablet computer, a laptop computer, a computer, a smart television (TV), or a navigation.

Hereinafter, a direction substantially normal to a plane defined by the first direction DR1 and the second direction DR2 is defined as a third direction DR3. The third direction DR3 may be a thickness direction of the electronic device ED. In the specification the meaning of "when viewed in a plan view" may refer to "when viewed in the third direction DR3".

A top surface of the electronic device ED may be defined as a display surface IS and may be parallel to the plane defined by the first direction DR1 and the second direction DR2. Images IM generated by the electronic device ED may be provided to a user through the display surface IS.

The display surface IS may be divided into a transmission region TA and a bezel region BZA. The transmission region TA may be a region for displaying the images IM. A user views the images IM through the transmission region TA. According to an embodiment, the transmission region TA may have vertexes in a rounded-rectangular shape. However, the shape is provided for the illustrative purpose. In an embodiment, for example, the transmission region TA may have various shapes, and not limited to any one embodiment.

The bezel region BZA is adjacent to the transmission region TA. The bezel region BZA may have specific color. The bezel region BZA may surround the transmission region TA. Accordingly, the shape of the transmission region TA may substantially be defined by the bezel region BZA. However, the above shape of the bezel region BZA is provided by way of example. In an embodiment, for example, the bezel region BZA may be disposed adjacent to only one side of the transmission region TA or may be omitted.

The electronic device ED may detect an external input applied from the outside. The external input may include various types of inputs provided outside the electronic device ED. In an embodiment, for example, as well as a touch by a part, such as a hand US_F, of a user bod or a touch by an additional equipment (for example, an active pen, or a digitizer), the external input may include an external input (for example, a hovering input) which is applied in a state in which the user hand approaches the electronic device ED or is close to the electronic device ED within a given distance. In addition, the external input may have various types such as force, pressure, temperature, and light.

The electronic device ED may sense biometric information of the user, which is applied from the outside. The display surface IS of the electronic device ED may have a biometric information sensing region for sensing the biometric information of the user. The biometric information sensing region may be provided with respect to the whole region of the transmission region TA or the partial region of the transmission region TA.

Figure 2A:
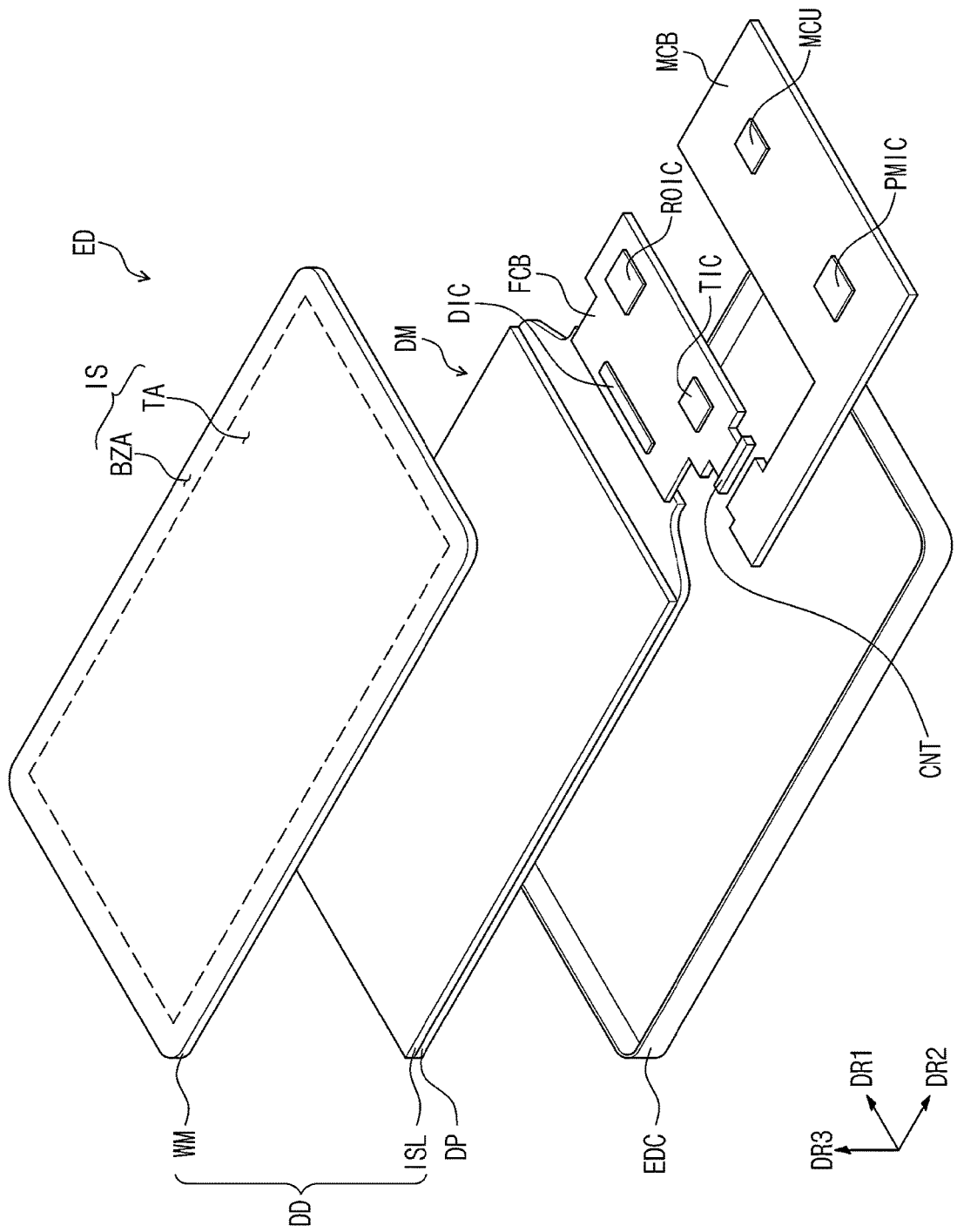
FIG. 2A is an exploded perspective view of an electronic device according to an embodiment of the disclosure.
Figure 2B:
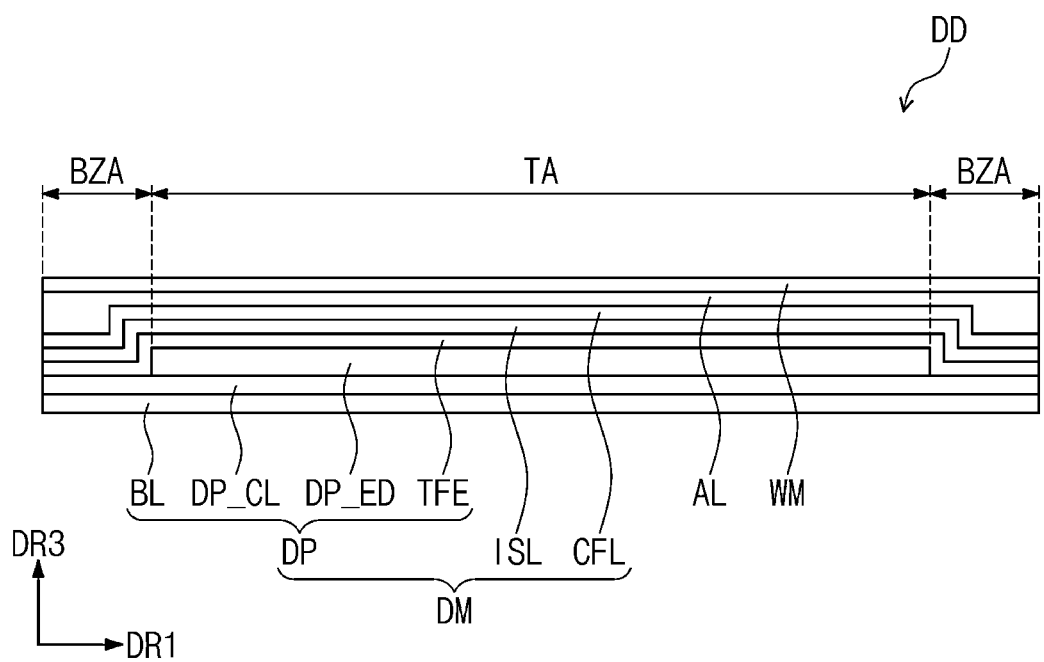
FIG. 2B is a cross-sectional view of a display device according to an embodiment of the disclosure.

FIG. 2A is an exploded perspective view of an electronic device according to an embodiment of the disclosure, and FIG. 2B is a cross-sectional view illustrating a display device according to an embodiment of the disclosure.

Referring to FIGS. 2A and 2B, an embodiment of the electronic device ED may include a display device DD, an electronic module, and a housing EDC. The display device DD may include a window WM and a display module DM, and may be disposed (received or accommodated) in the housing EDC. According to an embodiment, the window WM is coupled to the housing EDC to form an outer appearance of the electronic device ED.

The front surface of the window WM may define the display surface IS of the electronic device ED. The window WM may include an optically transparent insulating material. In an embodiment, for example, the window WM may include glass or plastic. The window WM may have a multi-layer structure or a single-layer structure. In an embodiment, for example, the window WM may include a plurality of plastic film coupled to each other through an adhesive agent or may include a glass substrate and a plastic film coupled to each other through the adhesive agent.

The display module DM may include a display panel DP and an input sensing layer ISL. The display panel DP may display an image in response to an electrical signal, and the input sensing layer ISL may sense the external input applied from the outside. The external input may be provided in various forms.

According to an embodiment of the disclosure, the display panel DP may be an emissive-type display pane, and the disclosure is not limited thereto. In an embodiment, for example, the display panel DP may include an organic light emitting display panel, an inorganic light emitting display panel, or a quantum-dot light emitting display panel. A light emitting layer of the organic light emitting display panel may include an organic light emitting material, and a light emitting layer of the inorganic light emitting display panel may include an inorganic light emitting material. A light emitting layer of the quantum dot light emitting display panel may include a quantum dot and a quantum rod. Hereinafter, for convenience of description, embodiments where the display panel DP is an organic light emitting display panel will be described in detail, but not being limited thereto.

Referring to FIG. 2B, in an embodiment, the display panel DP includes a base layer BL, a circuit layer DP_CL, an element layer DP_ED, and an encapsulation layer TFE. The display panel DP according to the disclosure may be a flexible display panel. However, the disclosure is not limited thereto. In an embodiment, for example, the display panel DP may be a foldable display panel, which is folded about to a folding axis, or a rigid display panel.

In an embodiment, the base layer BL may include a synthetic resin layer. The synthetic resin layer may be a polyimide-based resin layer, and the material of the polyimide-based resin layer is not particularly limited. In an embodiment, the base layer BL may include a glass substrate, a metal substrate, or an organic/inorganic composite substrate.

The circuit layer DP_CL is provided (disposed or formed) on the base layer BL. The circuit layer DP_CL is interposed between the base layer BL and the element layer DP_ED. The circuit layer DP_CL includes at least one insulating layer and a circuit element. Hereinafter, the insulating layer included in the circuit layer DP_CL may be referred to as an intermediate insulating layer. The intermediate insulating layer includes at least one intermediate inorganic film and at least one intermediate organic film. The circuit element may include a pixel driving circuit included in each of a plurality of pixels to display an image and a sensor driving circuit included in each of a plurality of sensors to recognize external information. The external information may be biometric information. According to an embodiment of the disclosure, each of the sensors may include a fingerprint recognizing sensor, a proximity sensor, an iris recognizing sensor, a blood measuring sensor, or an illuminance sensor. In addition, each of the sensors may be an optical sensor to optically recognize biometrics information. The circuit layer DP_CL may further include signal lines connected to the pixel driving circuit and/or the sensor driving circuit.

The element layer DP_ED may include a light emitting element included in each pixel and a light receiving element included in each of the sensors. According to an embodiment of the disclosure, the light receiving element may be a photodiode. The light receiving element may be a sensor to sense light reflected by a fingerprint of the user or responding to light.

The encapsulation layer TFE encapsulates the element layer DP_ED. The encapsulation layer TFE may include at least one organic film and at least one inorganic film. The inorganic film may include an inorganic material to protect the element layer DP_ED from moisture/oxygen. The inorganic film may include a silicon nitride layer, a silicon oxy nitride layer, a silicon oxide layer, a titanium oxide layer, or an aluminum oxide layer, but the disclosure is not limited thereto. The organic layer may include an organic material, and may protect the element layer DP_eD from foreign substances such as dust particles.

The input sensing layer ISL may be formed on the display panel DP. The input sensing layer ISL may be directly disposed on the encapsulation layer TFE. According to an embodiment of the disclosure, the input sensing layer ISL may be formed on the display panel DP through subsequent processes. In other words, when the input sensing layer ISL is directly disposed on the display panel DP, the adhesive film is not interposed between the input sensing layer ISL and the encapsulation layer TFE. Alternatively, the adhesive film may be interposed between the input sensing layer ISL and the display panel DP. In such an embodiment, the input sensing layer ISL and the display panel DP are not fabricated through the subsequent processes. In other words, after fabricating the input sensing layer ISL through a process separate from that of the display panel DP, the input sensing layer ISL may be fixed on a top surface of the display panel DP through the adhesive film.

The input sensing layer ISL may sense the external input (for example, a touch of the user), may change the sensed input into a specific input signal, and may provide the input signal to the display panel DP. The input sensing layer ISL may include a plurality of sensing electrodes to sense an external input. The sensing electrodes may sense the external input in a capacitive type. The display panel DP may receive an input signal from the input sensing layer ISL and may generate an image corresponding to the input signal.

The display module DM may further include a color filter layer CFL. According to an embodiment of the disclosure, the color filter layer CFL may be disposed on the input sensing layer ISL. However, the disclosure is not limited thereto. In an embodiment, for example, the color filter layer CFL may be interposed between the display panel DP and the input sensing layer ISL. The color filter layer CFL may include a plurality of color filters and a black matrix.

According to an embodiment of the disclosure, the display device DD may further include an adhesive layer AL. The window WM may be attached to the input sensing layer ISL through the adhesive layer AL. The adhesive layer AL may include an optically clear adhesive (OCA), an optically clear resin (OCR), or a pressure sensitive adhesive (PSA).

In an embodiment, as shown in FIG. 2A, the display module DM may further include a display driving circuit DIC (or a display driving chip), a flexible circuit film FCB, a touch driving circuit TIC (or a touch driving hip), and a read-out circuit ROIC (or a read-out chip). According to an embodiment of the disclosure, the display driving circuit DIC, the touch driving circuit TIC, and the read-out circuit ROIC may be provided in a chip form and may be mounted on the flexible circuit film FCB. However, the disclosure is not limited thereto. Alternatively, the display driving circuit DIC may be disposed on the display panel DP. The display driving circuit DIC may include a data driving circuit to provide a data signal to the display panel DP. Alternatively, the display driving circuit DIC may further include a driving control circuit to control the driving of the data driving circuit. In other words, the display driving circuit DIC may have the form of one integrated chip in which the data driving circuit and the driving control circuit are integrated.

The flexible circuit film FCB may be coupled to the display panel DP. The flexible circuit film FCB may be coupled to one end portion of the display panel DP to electrically connect the display driving circuit DIC to the display panel DP. The flexible circuit film FCB may electrically connect the touch driving circuit TIC to the input sensing layer ISL, and electrically connect the read-out circuit ROIC to the display panel DP.

Although FIG. 2A illustrates an embodiment having a structure in which the touch driving circuit TIC and the read-out circuit ROIC are individually provided, the disclosure is not limited thereto. In an embodiment, for example, the touch driving circuit TIC and the read-out circuit ROIC may be integrated in the form of one chip.

The electronic module may further include a main circuit board MCB. According to an embodiment of the disclosure, the main circuit board MCB may be electrically connected to the flexible circuit film FCB through a connector CNT. The main circuit board MCB may include a main processor MCU and a power managing circuit PMIC (or a power managing chip). The main processor MCU and the power managing circuit PMIC may be electrically connected to the display driving circuit DIC through the connector CNT.

The main processor MCU may control the overall operation of the electronic device ED. The main processor MCU may include at least one of a central processing unit (CPU) or an application processor (AP). The main processor MCU may include at least one selected from a graphic processing unit (GPU), a communication processor (CP), and an image signal processor (ISP). The main processor MCU may provide an image signal and various control signals used for displaying an image to the display driving circuit DIC.

The power managing circuit PMIC may receive an external supply voltage (for example, a battery voltage). In an embodiment, for example, the power managing circuit PMIC may generate a voltage to be supplied to the display device DD, based on the external supply voltage. The power managing circuit PMIC may include at least one regulator. The at least one regulator may generate an output voltage having various voltage levels, based on the external supply voltage.

Although FIG. 2A illustrates an embodiment having a structure in which the power managing circuit PMIC is provided in the form of a chip mounted on the main circuit board MCB, the disclosure is not limited thereto. In an embodiment, for example, the power managing circuit PMIC may be provided as a component included in the display device DD, such as a component mounted in the form of a chip on the flexible circuit film FCB.

The electronic module may further include various functional modules, such as a camera module, or a sensor module, in addition to the main circuit board MCB, the main processor MCU, and the power managing circuit PMIC.

The housing EDC is coupled to the window WM. The housing EDC is coupled to the window WM to provide a specific inner space. The display device DD and the electronic module may be received in the inner space of the housing EDC. The housing EDC may include a material having relatively high rigidity. In an embodiment, for example, the housing EDC may include a plurality of frames and/or plates including glass, plastic, or metal, or the combination thereof. The housing EDC may stably protect components of the display device DD and the electronic module, which are received in the inner space, from external impact.

Although not illustrated, the battery module to supply the supply voltage used for the overall operation of the display device DD may be interposed between the display module DM and the housing EDC.

Figure 3A:
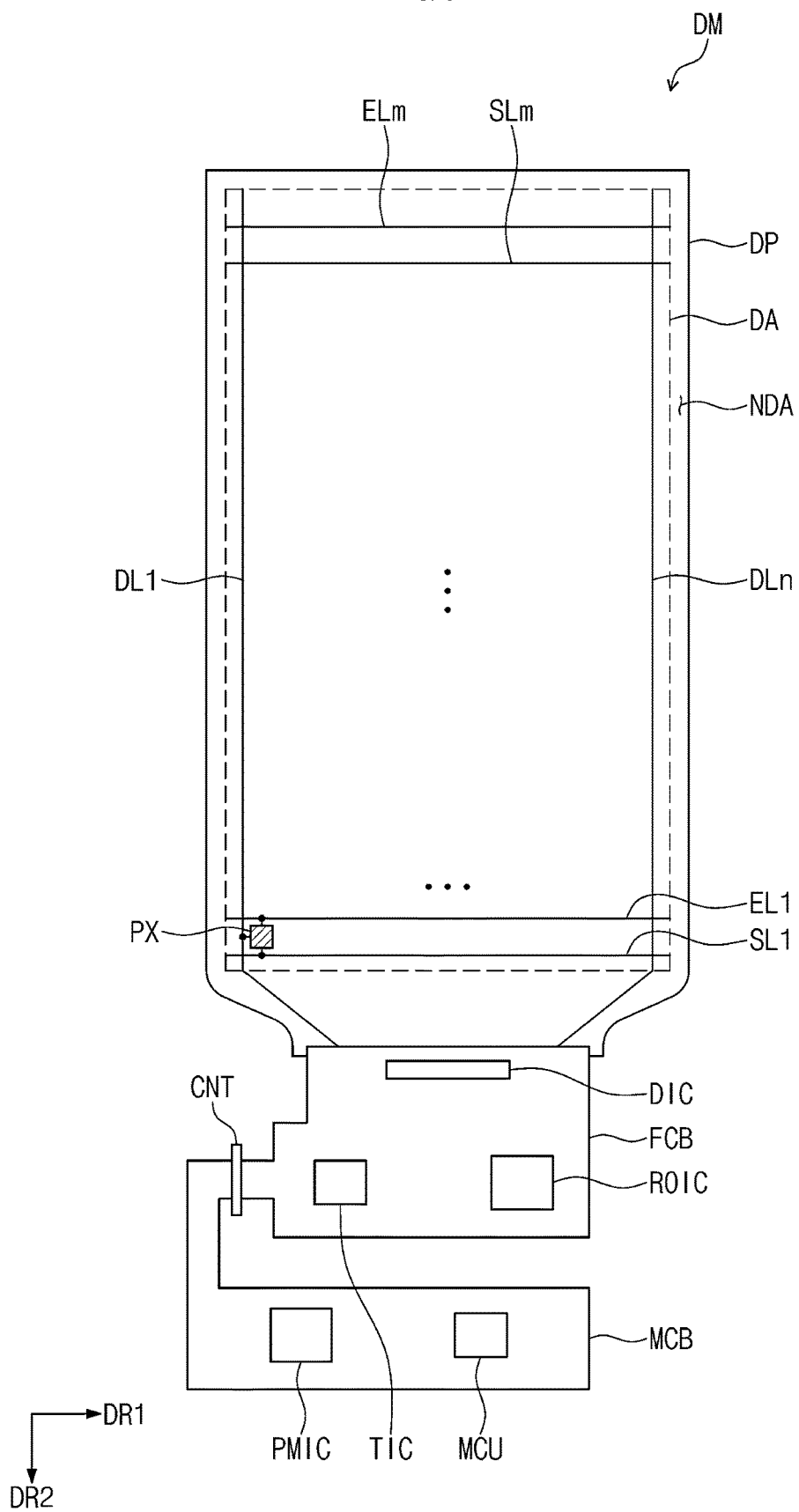
FIG. 3A is a plan view illustrating a display module and a main circuit board according to an embodiment of the disclosure.
Figure 3B:
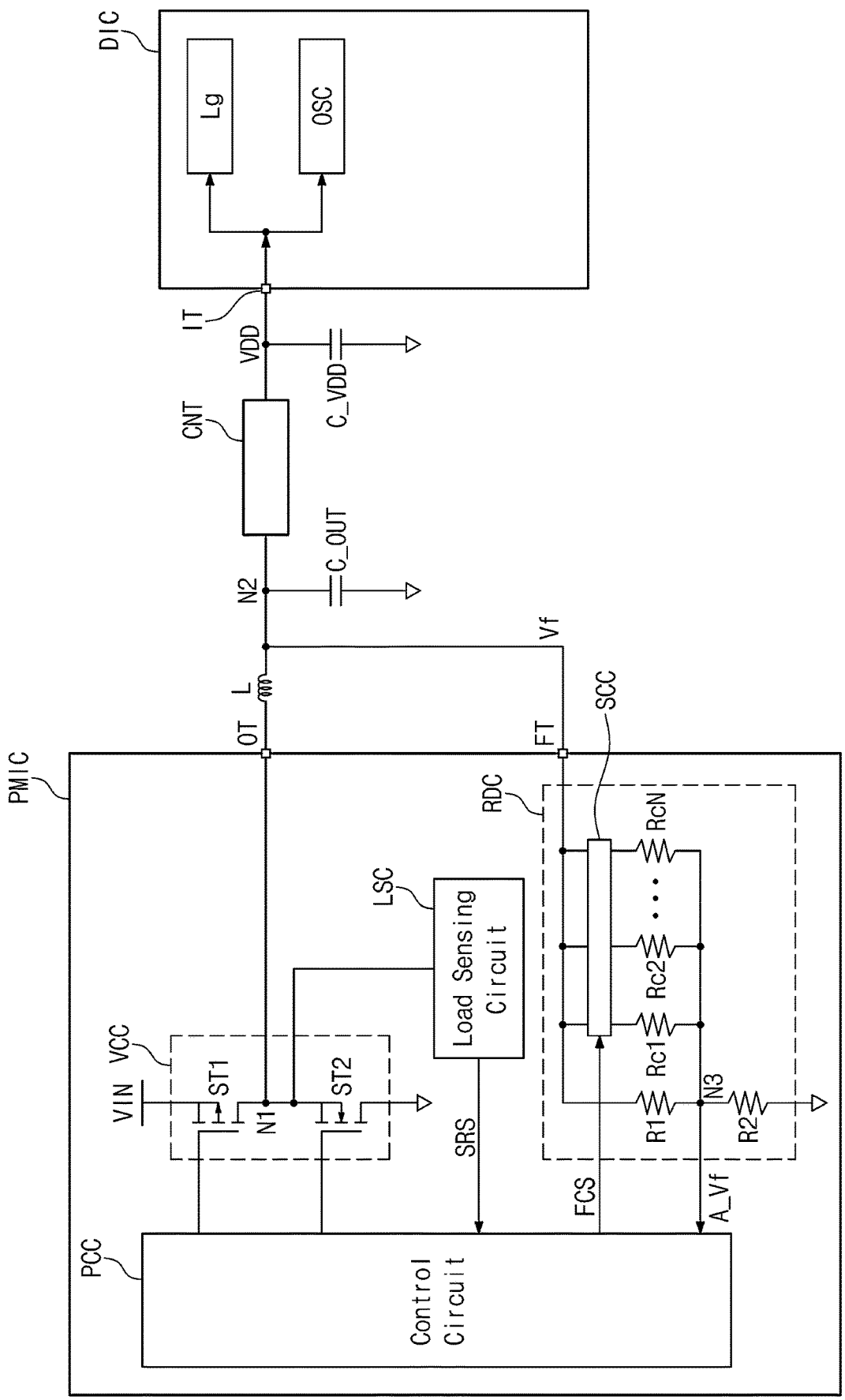
FIG. 3B is a block diagram illustrating a power managing circuit and a display driving circuit illustrated in FIG. 3A.

FIG. 3A is a plan view of a display module and a main circuit board according to an embodiment of the disclosure, and FIG. 3B is a block diagram illustrating a power managing circuit and a display driving circuit illustrated in FIG. 3A.

Referring to FIG. 3A, in an embodiment, the display panel DP includes a display region DA and a non-display region NDA. The display region DA is a region in which an image is substantially displayed, and the non-display region NDA is a region in which the image is not displayed. The display region DA may correspond to the transmission region TA (see FIG. 1) of the electronic device ED, and the non-display region NDA may correspond to the bezel region BZA (see FIG. 1) of the electronic device ED. According to an embodiment of the disclosure, the non-display region NDA surrounds the display region DA.

The display panel DP includes a plurality of pixels PX disposed in the display region DA. The plurality of pixels PX are disposed in the entire portion of the display region DA. The display panel DP may further include a plurality of scan lines SL1 to SLm, a plurality of data lines DL1 to DLn, and a plurality of light emitting lines EL1 to ELm. In this case, "m" and "n" are natural numbers. The pixels PX may be connected to the scan lines SL1 to SLm, the data lines DL1 to DLn, and the light emitting lines EL1 to ELm.

The scan lines SL1 to SLm may extend in the first direction DR1 and may be connected to a scan driving circuit. The light emitting lines EL1 to ELm may extend in the first direction DR1 and may be connected to a light emitting driving circuit. The scan driving circuit and the light emitting driving circuit may be provided in the non-display region NDA of the display panel DP through the same process as a process for the pixels PX.

The data lines DL1 to DLn may extend in the second direction DR2 and may be electrically connected to the display driving circuit DIC. The display panel DP may further include a power line for supplying various driving voltages to the pixels PX.

Referring to FIG. 3B, in an embodiment, the power managing circuit PMIC may include a converting circuit VCC, a load sensing circuit LSC, a resistance dividing circuit RDC, and a control circuit PCC. The control circuit PCC may be electrically connected to the converting circuit VCC, the load sensing circuit LSC, and the resistance dividing circuit RDC.

The power managing circuit PMIC may output a driving voltage VDD to be supplied to the display driving circuit DIC through an output terminal OT. The converting circuit VCC may be connected to the output terminal OT of the power managing circuit PMIC. The converting circuit VCC includes a first switching transistor ST1 and a second switching transistor ST2. The first switching transistor ST1 and the second switching transistor ST2 may be transistors in mutually different types. In an embodiment, for example, the first switching transistor ST1 may be a P-type transistor, and the second switching transistor ST2 may be an N-type transistor.

The first switching transistor ST1 is connected between an input terminal, which receives an input voltage VIN, and a first node N1, and receives a pulse width modulation signal from the control circuit PCC. The second switching transistor ST2 is connected between the first node N1 and a ground terminal, and receives the pulse width modulation signal from the control circuit PCC. In response to the pulse width modulation signal, the first and second switching transistors ST1 and ST2 may be alternately turned on. In an embodiment, for example, during an on-duty period of the pulse width modulation signal, the first switching transistor ST1 may be turned off, and the second switching transistor ST2 may be turned on. In such an embodiment, during an off-duty period of the pulse width modulation signal, the first switching transistor ST1 may be turned on and the second switching transistor ST2 may be turned off.

The control circuit PCC may include a pulse width modulating circuit. The control circuit PCC may generate the pulse width modulation signal through the pulse width modulating circuit. The pulse width modulation signal includes the on-duty period and the off-duty period, and the control circuit PCC may control a level of the driving voltage VDD output from the converting circuit VCC by adjusting a proportion (i.e., a duty ratio) occupied by the on-duty period in a period of the pulse width modulation signal.

The first node N1 of the converting circuit VCC may be connected to the output terminal OT. An inductor L and an output capacitor C_OUT may be further connected to the output terminal OT of the power managing circuit PMIC. The inductor L is connected between the output terminal OT and a second node N2, and the output capacitor C_OUT is connected between the second node N2 and the ground terminal.

In an embodiment, when the first switching transistor ST1 is turned on and the second switching transistor ST2 is turned off, electric charges may be stored in the output capacitor C_OUT while a current is supplied to the inductor L. In such an embodiment, when the first switching transistor ST1 is turned off and the second switching transistor ST2 is turned on, a current based on the electric charges stored in the output capacitor C_OUT may be output to an input terminal IT of the display driving circuit DIC. Therefore, the display driving circuit DIC may receive the driving voltage VDD corresponding to the current.

The connector CNT connected the main circuit board MCB (see FIG. 3A) and the flexible circuit board FCB (see FIG. 3A) may electrically connect the output terminal OT of the power managing circuit PMIC to the input terminal IT of the display driving circuit DIC. The connector CNT may include a voltage pin to supply the driving voltage VDD output from the power managing circuit PMIC to the display driving circuit DIC. Therefore, the driving voltage VDD output from the output terminal OT of the power managing circuit PMIC may be supplied to the input terminal IT of the display driving circuit DIC through the voltage pin of the connector CNT. In an embodiment, a parasitic capacitor C_VDD may be connected to the input terminal IT of the display driving circuit DIC.

The driving voltage VDD input through the input terminal IT of the display driving circuit DIC may be used as an oscillator voltage for operating an oscillator OSC or a logic voltage for controlling driving of a logic Lg in the display driving circuit DIC.

The load sensing circuit LSC may be connected to the converting circuit VCC to sense a load current of the output terminal OT, and may generate a sensing result signal SRS by processing the load current. The sensing result signal SRS generated from the load sensing circuit LSC may be applied to the control circuit PCC. According to an embodiment of the disclosure, the load sensing circuit LSC may be connected to the first node N1. However, the disclosure is not limited thereto. In an embodiment, the load sensing circuit LSC may be directly connected to the output terminal OT.

The control circuit PCC may generate a feedback control signal FCS based on the sensing result signal SRS received from the load sensing circuit LSC, and may provide the feedback control signal FCS to the resistance dividing circuit RDC.

According to an embodiment of the disclosure, the second node N2 may be electrically connected to a feedback terminal FT of the power managing circuit PMIC. The resistance dividing circuit RDC may be connected to the feedback terminal FT. The power managing circuit PMIC may receive feedback (i.e., a feedback voltage Vf) with respect to the driving voltage VDD through the feedback terminal FT.

According to an embodiment of the disclosure, the resistance dividing circuit RDC includes a first resistor R1, a second resistor R2, and a plurality of adjusting resistors (for example, first to N-th adjusting resistors Rc1 to RcN). The first resistor R1 is connected between the feedback terminal FT and a dividing node N3, and the second resistor R2 is connected between the dividing node N3 and a ground terminal. The adjusting resistors Rc1 to RcN are connected in parallel to the first resistor R1. In this case, "N" is a natural number equal to or greater than 1.

According to an embodiment of the disclosure, the first resistor R1 and the second resistor R2 may have resistances equal to each other, and each of the adjusting resistors Rc1 to RcN may have a resistance smaller than the resistances of the first and second resistors R1 and R2. In an embodiment, for example, each of the adjusting resistors Rc1 to RcN may have a resistance equal to 1/10 of the resistances of the first and second resistors R1 and R2.

The resistance dividing circuit RDC may further include a switching control circuit SCC connected to the adjusting resistors Rc1 to RcN. The switching control circuit SCC may receive the feedback control signal FCS from the control circuit PCC and adjust the number of the adjusting resistors Rc1 to RcN connected to the first resistor R1 in response to the feedback control signal FCS. The switching control circuit SCC will be described later in greater detail with reference to FIG. 8.

A level of an actual feedback voltage A_Vf fed back to the control circuit PCC may vary depending on the number of the adjusting resistors Rc1 to RcN connected to the first resistor R1.

The control circuit PCC may adjust the number of the adjusting resistors Rc1 to RcN connected in parallel to the first resistor R1 based on the load current, and thus control the degree of boosting of the driving voltage VDD by varying the level of the actual feedback voltage A_Vf. Accordingly, the power managing circuit PMIC may stably supply the driving voltage VDD having a desired level to the display driving circuit DIC by outputting the boosted driving voltage VDD in consideration of a decrease in the voltage level of the driving voltage VDD due to the wiring resistance (i.e., IR Drop or voltage drop) in the process of the driving voltage VDD is supplied to the display driving circuit DIC.

Figure 4A:
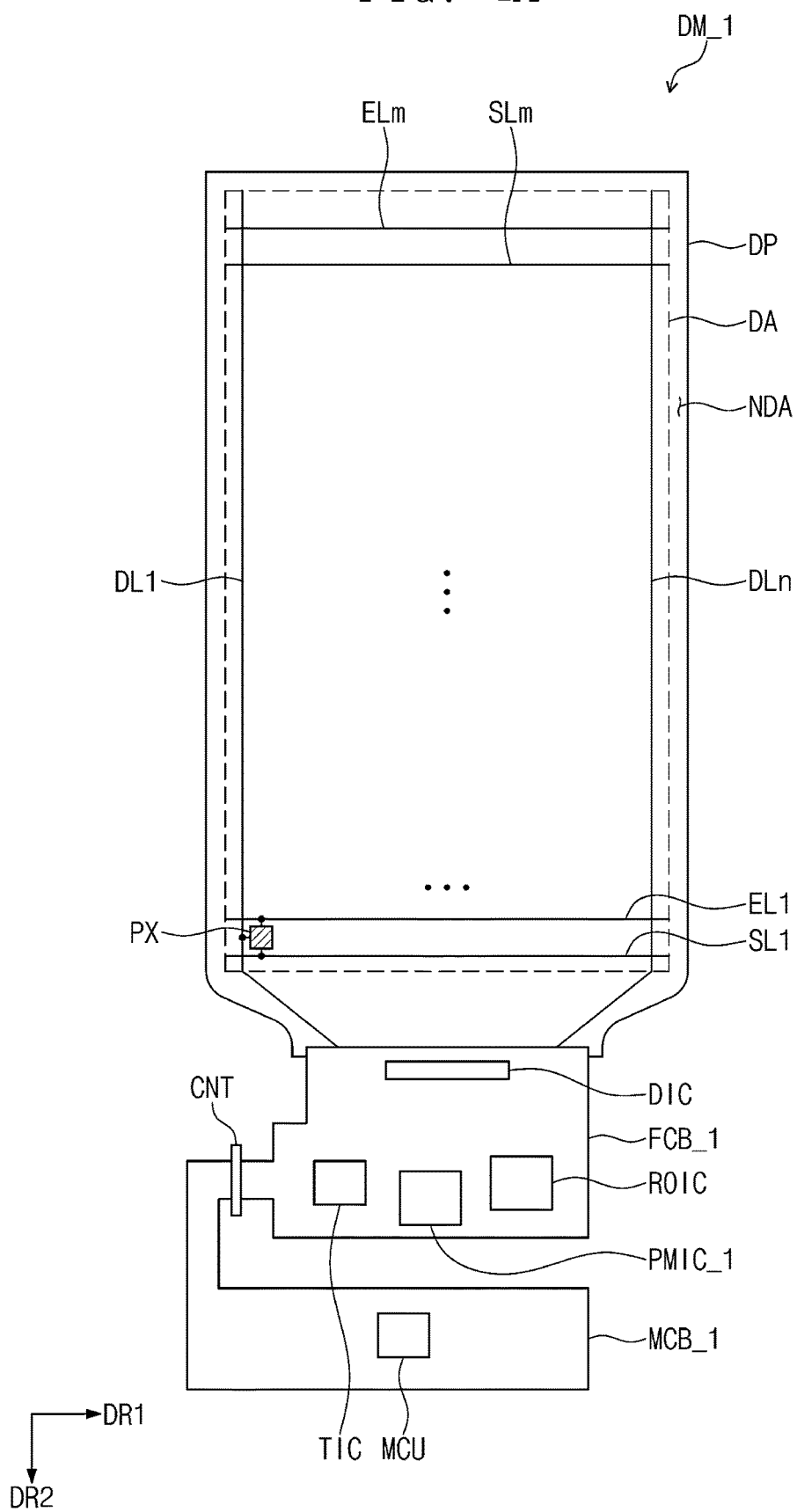
FIG. 4A is a plan view illustrating a display module according to an embodiment of the disclosure.
Figure 4B:
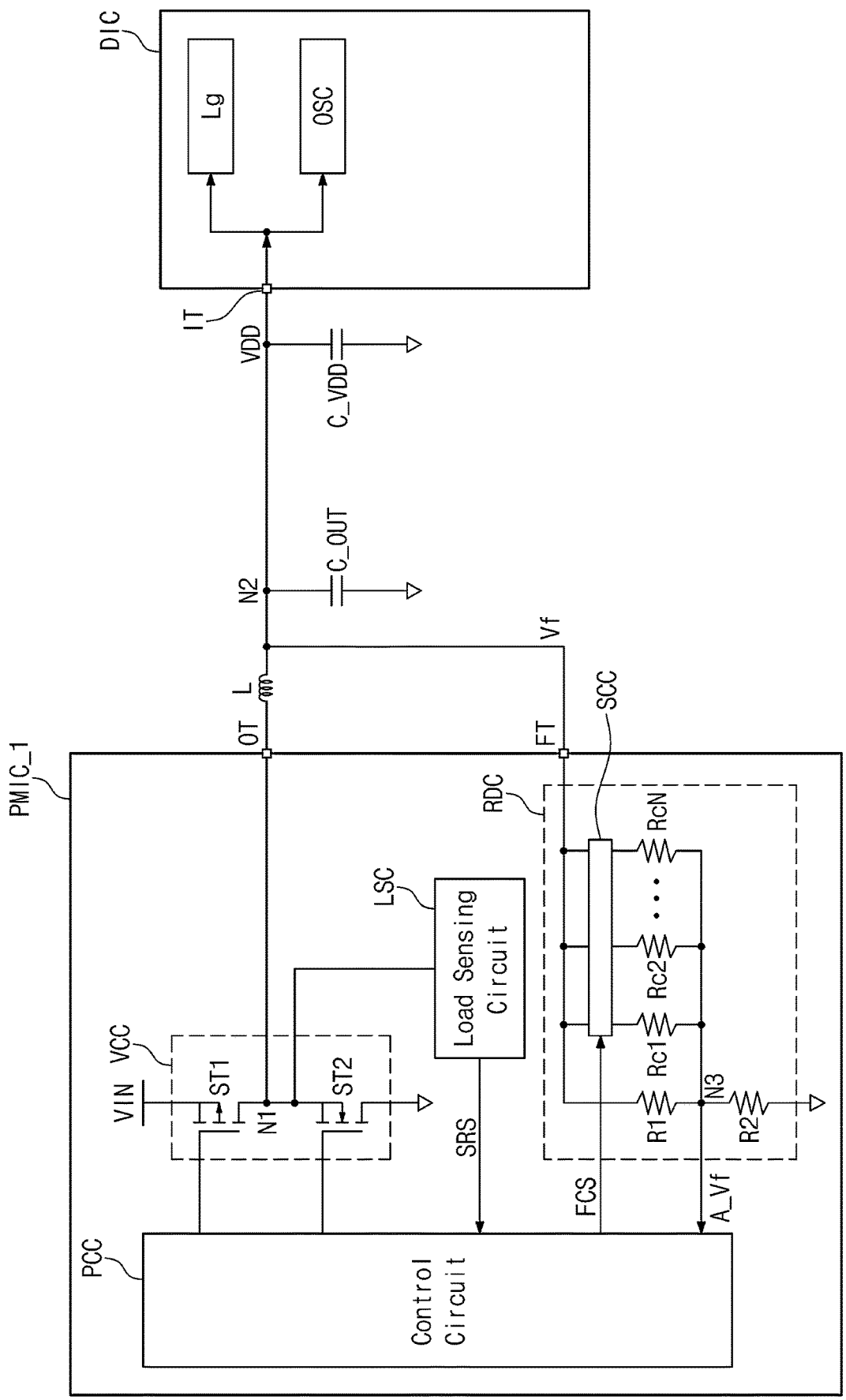
FIG. 4B is a block diagram illustrating a power managing circuit and a display driving circuit illustrated in FIG. 4A.

FIG. 4A is a plan view of a display module according to an embodiment of the disclosure, and FIG. 4B is a block diagram illustrating a power managing circuit and a display driving circuit illustrated in FIG. 4A. In FIGS. 4A and 4B, the same reference numerals are assigned to the same components as those illustrated in FIGS. 3A and 3B, and any repetitive detailed description thereof will be omitted.

Referring to FIGS. 4A and 4B, a display module DM_1 according to an embodiment of the disclosure may include a power managing circuit PMIC_1. In an embodiment, the power managing circuit PMIC_1 may be mounted in the form of a chip on a flexible circuit film FCB_1. In an embodiment, the power managing circuit PMIC_1 may be included in a component of the display device DD.

In an embodiment where the power managing circuit PMIC_1 is mounted on the flexible circuit film FCB_1 together with the display driving circuit DIC, the connector CNT may not be provided between the power managing circuit PMIC_1 and the display driving circuit DIC. Accordingly, voltage pins for providing the driving voltage VDD output from the power managing circuit PMIC_1 to the display driving circuit DIC may be omitted from the connector CNT, and accordingly, the total number of pins provided in the connector CNT may be reduced.

A signal line is interposed between the output terminal OT of the power managing circuit PMIC_1 and the input terminal IT of the display driving circuit DIC to connect the output terminal OT of the power managing circuit PMIC_1 to the input terminal IT of the display driving circuit DIC. In the process of supplying the driving voltage VDD, which is output from the power managing circuit PMIC_1, to the display driving circuit DIC, the IR drop may be caused (or occur) due to the signal line.

In such an embodiment, the control circuit PCC may adjust the number of the adjusting resistors Rc1 to RcN connected in parallel to the first resistor R1 based on the load current, and thus control the degree of boosting of the driving voltage VDD by varying the level of the actual feedback voltage A_Vf. In other words, the power managing circuit PMIC_1 may stably supply the driving voltage VDD having the desired level to the display driving circuit DIC by outputting the boosted driving voltage VDD in consideration of a decrease in the voltage level of the driving voltage VDD due to IR drop in the process of supplying the driving voltage VDD to the display driving circuit DIC.

Figure 5:
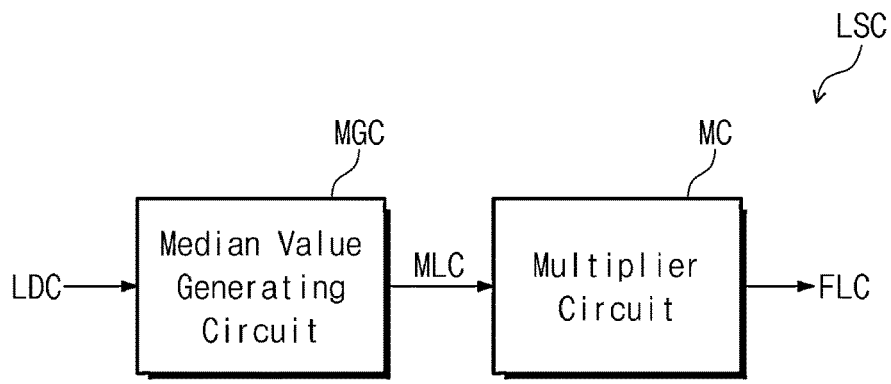
FIG. 5 is a block diagram of a load sensing circuit according to an embodiment of the disclosure.
Figure 6:
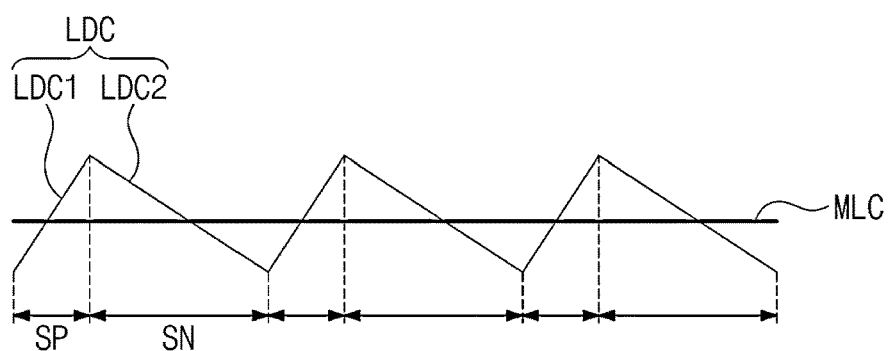
FIG. 6 is a waveform diagram illustrating input and output signals of a median value generating circuit illustrated in FIG. 5.

FIG. 5 is a block diagram of a load sensing circuit according to an embodiment of the disclosure. FIG. 6 is a waveform diagram illustrating input/output signals of a median value generating circuit illustrated in FIG. 5, and FIG. 7 is a waveform diagram illustrating input and output signals of a multiplier circuit illustrated in FIG. 5.

Referring to FIGS. 5 and 6, in an embodiment, the load sensing circuit LSC includes a median value generating circuit MGC and a multiplier circuit MC.

The median value generating circuit MGC receives a load current LDC of the first node N1 and outputs the median value of the load current LDC as a median load current MLC. The first node N1 outputs a first load current LDC1 during a first period SP in which the first switching transistor ST1 is turned on, and outputs a second load current LDC2 during a second period SN in which the second switching transistor ST2 is turned on. The median load current MLC may correspond to a median value of the first and second load currents LDC1 and LDC2.

Figure 7:
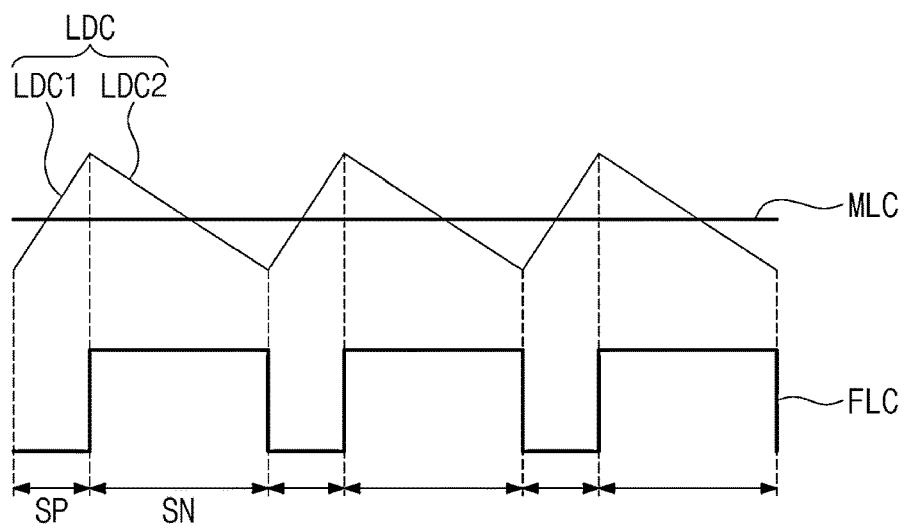
FIG. 7 is a waveform diagram illustrating the input and output signals of a multiplier circuit illustrated in FIG. 5.

Referring to FIGS. 5 and 7, the multiplier circuit MC may receive the median load current MLC from the median value generating circuit MGC and may receive the pulse width control signal from the control circuit PCC. In other words, the multiplier circuit MC may output a final load current FLC by reflecting the duty ratio of the pulse width control signal to the median load current MLC. Accordingly, the final load current FLC may have a low level during the first period SP and a high level during the second period SN. The duty ratio of the final load current FLC may be defined as a proportion occupied by the second period SN in the period of the final load current FLC and may be determined by the duty ratio of the pulse width control signal. Alternatively, the final load current FLC may have the high level during the first period SP and the low level during the second period SN. In this case, the duty ratio of the final load current FLC may be defined as a proportion occupied by the first period SP in the period of the final load current FLC.

According to an embodiment of the disclosure, the load sensing circuit LSC may provide the final load current FLC as the sensing result signal SRS to the control circuit PCC.

The control circuit PCC may adjust the number of adjusting resistors Rc1 to RcN based on a magnitude of the final load current FLC. In an embodiment, for example, when the magnitude of the final load current FLC during the second period SN is about 50 milliampere (mA) or less, the control circuit PCC may set the number of adjusting resistors Rc1 to RcN to one. In in such an embodiment, when the magnitude of the final load current FLC during the second period SN is about 50 mA or greater and about 100 mA or less, the control circuit PCC may set the number of adjusting resistors Rc1 to RcN to two, and when the magnitude of the final load current FLC during the second period SN is about 100 mA or greater and about 150 mA or less, the control circuit PCC may set the number of adjusting resistors Rc1 to RcN to three.

Figure 8:
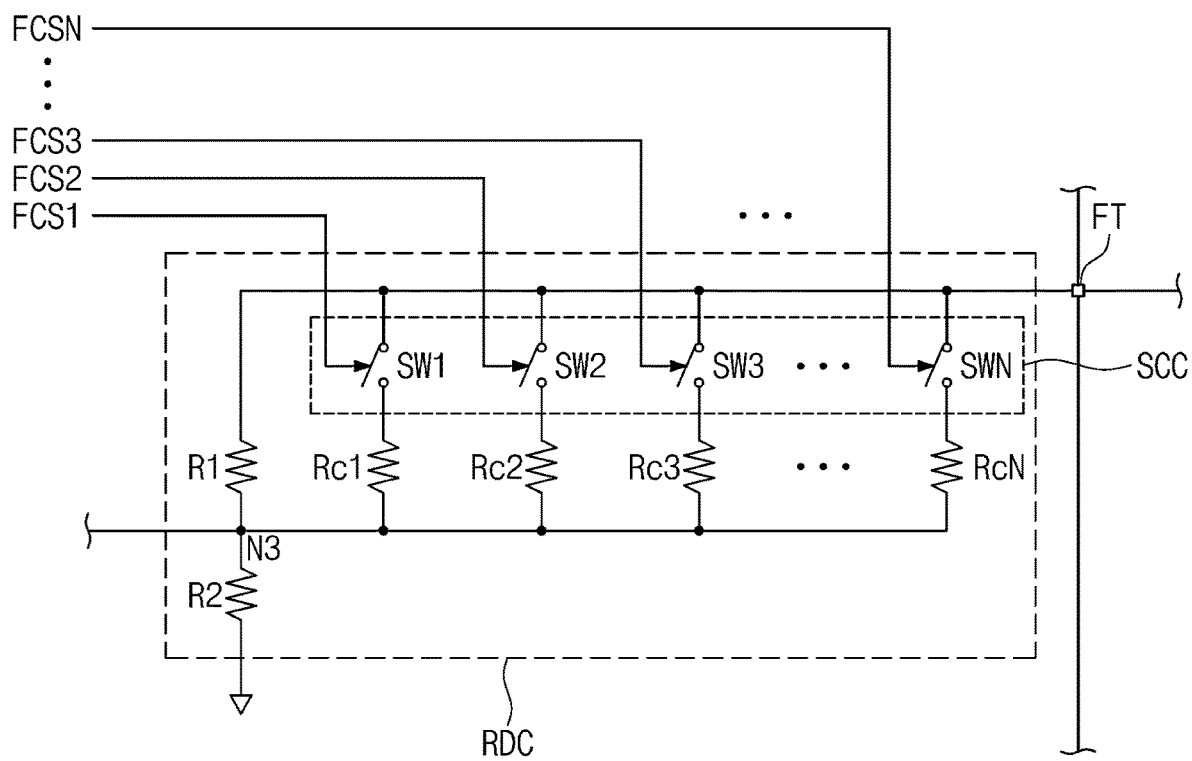
FIG. 8 is a circuit diagram illustrating a resistance dividing circuit illustrated in FIG. 3B.

The correspondence relationship between the magnitude of the final load current FLC and the number of adjusting resistors Rc1 to RcN may be stored in a look-up table, and the control circuit PCC may control the number of the adjusting resistors Rc1 to RcN connected to the first resistor R1 to correspond to the magnitude of the final load current FLC by making reference to the look-up table. FIG. 8 is a circuit diagram illustrating a resistance dividing circuit illustrated in FIG. 3B.

Referring to FIG. 8, in an embodiment, the resistance dividing circuit RDC includes the first resistor R1, the second resistor R2, and the plurality of adjusting resistors Rc1 to RcN (for example, first to N-th adjusting resistors). The first resistor R1 is connected between the feedback terminal FT and the dividing node N3, and the second resistor R2 is connected between the dividing node N3 and the ground terminal. The adjusting resistors Rc1 to RcN are connected in parallel to the first resistor R1. In this case, "N" is a natural number equal to or greater than 1.

The resistance dividing circuit RDC may further include the switching control circuit SCC connected to the adjusting resistors Rc1 to RcN. The switching control circuit SCC include a plurality of switching elements SW1 to SWN (or a first switching element to an N-th switching element) which are connected to the adjusting resistors Rc1 to RcN, respectively, to switch the connection between the adjusting resistors Rc1 to RcN and the dividing node N3, in response to feedback control signals FCS1 to FCSN (or a first feedback control signal to an N-th feedback control signal).

The control circuit PCC (See FIG. 3B) may control an activation state of each of the feedback control signals FCS1 to FCSN to determine the number of adjusting resistors Rc1 to RcN connected in parallel to the first resistor R1. In an embodiment, for example, when only the first switching element SW1 is turned on in response to the first feedback control signal FSC1, and the remaining switching elements SW2 to SWN may be turned off in response to the second to N-th feedback control signals FCS2 to FCSN, only one adjusting resistor (for example, the first adjusting resistor Rc1) among the adjusting resistors Rc1 to RcN is connected in parallel to the first resistor R1. When only the first and second switching elements SW1 and SW2 are turned on in response to the first and second feedback control signals FSC1 and FCS2, and the remaining switching elements SW3 to SWN may be turned off in response to the third to N-th feedback control signals FCS3 to FCSN, only two of the adjusting resistors Rc1 to RcN are connected in parallel to the first resistor R1.

When the number of adjusting resistors Rc1 to RcN connected to the first resistor R1 increases, the actual feedback voltage A_Vf may become lower than the feedback voltage Vf. In other words, as the final load current FLC increases and the number of adjusting resistors Rc1 to RcN connected in parallel to the first resistor R1 increases, the actual feedback voltage A_Vf may be further lowered than the feedback voltage Vf. When the actual feedback voltage A_Vf is lowered, the control circuit PCC may perform a compensation operation for boosting the driving voltage VDD by a level of the actual feedback voltage A_Vf lowered.

In an embodiment, for example, when the final load current FLC is sensed as about 50 mA and the wiring resistance is about 1 ohm ($\Omega$), the driving voltage VDD may be expected as being reduced by about 50 millivolt (mV). In this case, when one adjusting resistor (for example, the first adjusting resistor Rc1) is connected in parallel to the first resistor R1, the actual feedback voltage A_Vf is about 0.95 V, which may be lowered by about 50 mV from the feedback voltage Vf of about 1 V. In this case, since the actual feedback voltage A_Vf is lowered by about 50 mV from the feedback voltage Vf of about 1 V, the control circuit PCC may control the duty ratio of the pulse width control signal to output the driving voltage VDD boosted by about 50 mV.

In an embodiment, for example, when the final load current FLC is sensed as about 100 mA and the wiring resistance is about 1$\Omega$, the driving voltage VDD may be expected as decreasing by about 100 mV. In this case, when two adjusting resistors (for example, the first and second adjusting resistors Rc1 and Rc2) are connected in parallel to the first resistor R1, the actual feedback voltage A_Vf may be about 0.9 V, which is about 100 mV lower than the feedback voltage Vf of about 1 V. Since the actual feedback voltage A_Vf is lowered by about 100 mV from the feedback voltage Vf of about 1 V, the control circuit PCC may control the duty ratio of the pulse width control signal to output the driving voltage VDD boosted by about 100 mV.

In such an embodiment, the driving voltage VDD may be effectively prevented from being reduced by the wiring resistance (i.e., IR Drop), by adjusting the number of adjusting resistors Rc1 to RcN connected in parallel to the first resistor R1 based on the sensed load current. Accordingly, the power managing circuit PMIC may supply the driving voltage VDD, which is stably maintained at a constant level, to the display driving circuit DIC.

Figure 9:
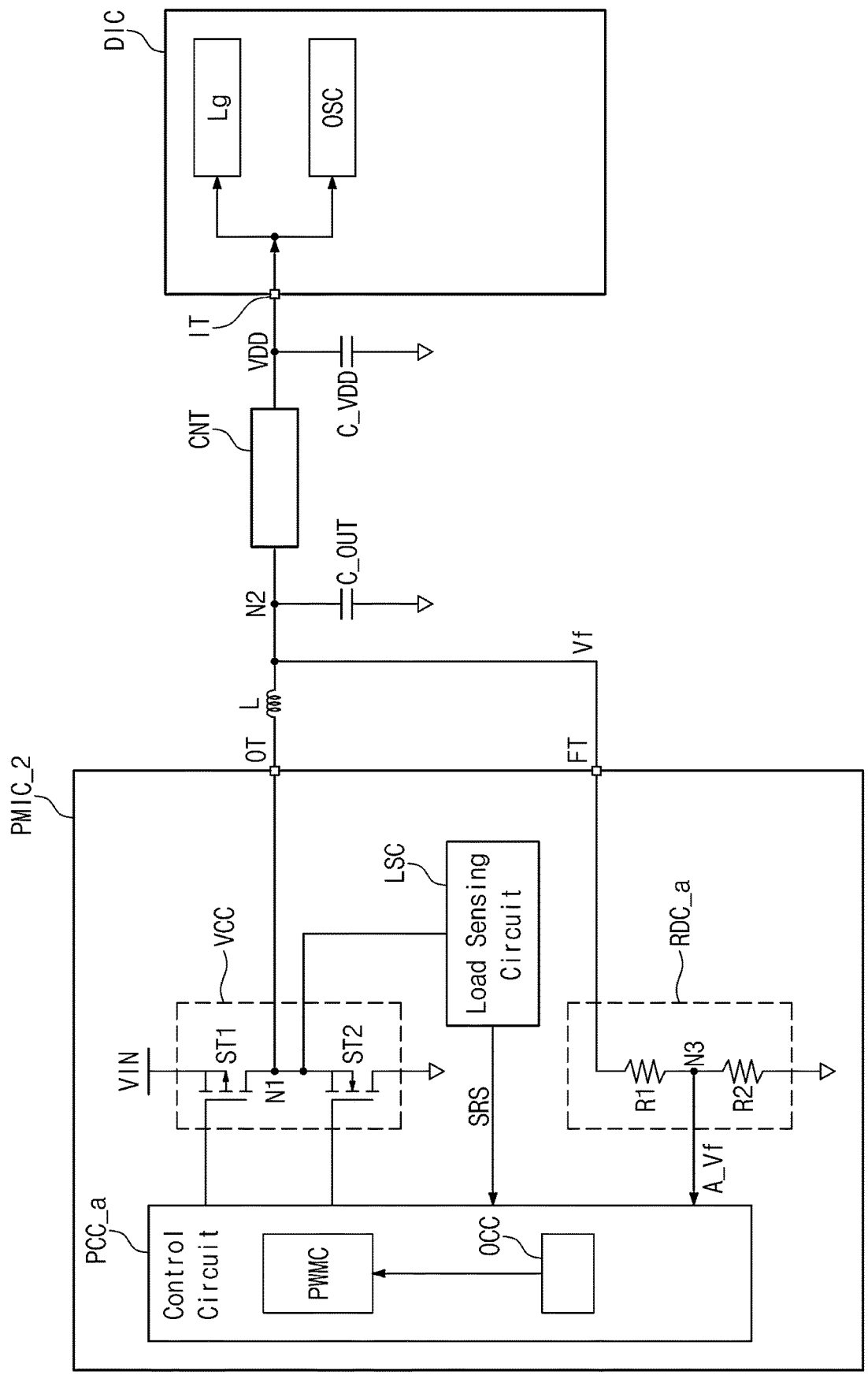
FIG. 9 is a block diagram illustrating a power managing circuit and a display driving circuit according to an embodiment of the disclosure.

FIG. 9 is a block diagram illustrating a power managing circuit and a display driving circuit according to an embodiment of the disclosure. In FIG. 9, the same reference numerals are assigned to the same components as those illustrated in FIG. 3B9, and any repetitive detailed thereof will be omitted.

Referring to FIG. 9, in an embodiment, a power managing circuit PMIC_2 may include the converting circuit VCC, the load sensing circuit LSC, a resistance dividing circuit RDC_a, and a control circuit PCC_a. The control circuit PCC_a may be electrically connected to the converting circuit VCC, the load sensing circuit LSC, and the resistance dividing circuit RDC_a.

The control circuit PCC_a may include a pulse width modulating circuit PWMC and an offset control circuit OCC. The pulse width modulating circuit PWMC may generate the pulse width modulation signal based on converting information. In an embodiment, for example, the converting information may be a digital signal. When the converting information is a 5-bit signal, the duty ratio of the pulse width modulation signal may be expressed as 32 5-bit signals. The pulse width modulating circuit PWMC may generate a pulse width modulation signal having a duty ratio corresponding to the converting information.

In an embodiment, for example, it may be assumed that a pulse width modulation signal having a duty ratio of 64% is generated based on a signal of '00000', and that the driving voltage VDD of 1V is generated based on the pulse width modulation signal having the duty ratio of 64%. When the signal of '00000' is input to the pulse width modulating circuit PWMC as the converting information, the pulse width modulation signal having the duty ratio of 64% is output, and the converting circuit VCC may output the driving voltage VDD of 1V in response to the pulse width modulation signal.

When the final load current FLC is sensed as about 50 mA and the wiring resistance is about 1$\Omega$, the IR drop of about 50 mV may be caused in the driving voltage VDD. In this case, to compensate for the IR drop of the driving voltage VDD, the offset control circuit OCC may change the converting information based on the final load current FLC. In an embodiment, for example, the signal of '00000' may be converted into a signal of '00001' based on the final load current FLC. Accordingly, the pulse width modulating circuit PWMC may output a pulse width modulation signal having a duty ratio corresponding to the signal of '00001', and accordingly, the converting circuit VCC may output the driving voltage VDD of about 1.05 V.

In such an embodiment, when the final load current FLC is sensed as about 100 mA and the wiring resistance is about 1Ω, the IR drop of about 100 mV may be caused in the driving voltage VDD. In this case, the offset control circuit OCC may convert the signal of '00000' into a signal of '00010' based on the final load current FLC to compensate for the IR drop of the driving voltage VDD. Accordingly, the pulse width modulating circuit PWMC may output a pulse width modulation signal having a duty ratio corresponding to the signal of '00010', and accordingly, the converting circuit may output the driving voltage VDD of about 1.1 V.

According to an embodiment of the disclosure, the second node N2 may be electrically connected to the feedback terminal FT of the power managing circuit PMIC_2. The resistance dividing circuit RDC_a may be connected to the feedback terminal FT. The power managing circuit PMIC_2 may receive feedback (i.e., the feedback voltage Vf) with respect to the driving voltage VDD through the feedback terminal FT.

According to an embodiment of the disclosure, the resistance dividing circuit RDC_a includes the first resistor R1 and the second resistor R2. The first resistor R1 is connected between the feedback terminal FT and the dividing node N3, and the second resistor R2 is connected between the dividing node N3 and the ground terminal. According to an embodiment of the disclosure, the first resistor R1 and the second resistor R2 may have resistances equal to each other.

In such an embodiment, when the offset control circuit OCC is provided in the control circuit PCC_a, the level of the driving voltage VDD may be changed by directly changing the converting information based on the final load current FLC. Therefore, the configuration of the adjusting resistors Rc1 to RcN and the switching circuits SCC illustrated in FIG. 3B may be omitted in the resistance dividing circuit RDC_a illustrated in FIG. 9.

According to an embodiment of the disclosure, the power managing circuit may vary the level of an actual feedback voltage actually fed back to the power managing circuit by sensing the load current at the output terminal through the load sensing circuit, and adjusting the number of adjusting resistors connected to the first resistor in parallel depending on the load current.

Accordingly, the boosting degree of the driving voltage may be controlled depending on the load current reflected with wiring resistance, such that the power managing circuit supplies the driving voltage having a desired voltage level to the display driving circuit, even if the voltage level is decreased due to the wiring resistance, in the process of supplying the driving voltage to the display driving circuit.

The invention should not be construed as being limited to the embodiments set forth herein. Rather, these embodiments are provided so that this disclosure will be thorough and complete and will fully convey the concept of the invention to those skilled in the art.

While the invention has been described with reference to embodiments thereof, it will be understood by those of ordinary skill in the art that various changes and modifications in form and details may be made thereto without departing from the spirit or scope of the invention as defined by the following claims.

What is claimed is:

1. A display device comprising:
a power managing circuit which receives an input voltage to generate a display driving voltage;
a display driving circuit which receives the display driving voltage to output a panel control signal; and
a display panel which receives the panel control signal to display an image,
wherein the power managing circuit includes:
a converting circuit which converts the input voltage into the display driving voltage, and outputs the display driving voltage through an output terminal;
a load sensing circuit connected to the converting circuit, wherein the load sensing circuit senses a load current of the output terminal and outputs a sensing result signal;
a resistance dividing circuit connected to a feedback terminal to receive a feedback voltage, wherein the resistance dividing circuit controls a level of the feedback voltage in response to a feedback control signal; and
a control circuit which controls an operation of the converting circuit by providing the feedback control signal to the resistance dividing circuit based on the sensing result signal.

2. The display device of claim 1, wherein the converting circuit includes:
a first switching transistor connected between an input terminal, which receives the input voltage, and a first node; and
a second switching transistor connected between the first node and a ground terminal,
wherein the first node is connected to the output terminal, and
wherein the load sensing circuit is connected to the first node to sense the load current.

3. The display device of claim 2, further comprising:
an inductor connected between the output terminal and a second node; and
an output capacitor connected between the second node and the ground terminal,
wherein the feedback terminal is connected to the second node.

4. The display device of claim 2, wherein the first switching transistor and the second switching transistor are transistors in mutually different types, and
wherein the first switching transistor and the second switching transistor receive a pulse width modulation signal from the control circuit and are alternately turned on in response to the pulse width modulation signal.

5. The display device of claim 4, wherein the load sensing circuit includes:
a median value generating circuit which outputs, as a median load current, a median value of a first load current during a first period in which the first switching transistor is turned on and a second load current during a second period in which the second switching transistor is turned on; and
a multiplier circuit which receives the median load current and the pulse width modulation signal and outputs, as the sensing result signal, a final load current generated by reflecting a duty ratio of the pulse width modulation signal to the median load current.

6. The display device of claim 1, wherein the resistance dividing circuit includes:

a first resistor connected between the feedback terminal and a dividing node;
a second resistor connected between the dividing node and a ground terminal; and
a plurality of adjusting resistors connected to the first resistor in parallel.

7. The display device of claim 6, wherein the first resistor and the second resistor have resistances equal to each other, and
wherein each of the adjusting resistors has a resistance less than the resistances of the first and second resistors.

8. The display device of claim 6, wherein the resistance dividing circuit further includes a plurality of switching elements which are connected to the plurality of adjusting resistors, and performs a switching operation for connection between the plurality of adjusting resistors and the dividing node, in response to the feedback control signal.

9. The display device of claim 8, wherein the feedback control signal includes:
a plurality of feedback control signals applied to the plurality of switching elements, respectively, and
wherein the control circuit determines a number of the adjusting resistors connected to the first resistor in parallel, by controlling an activation state of each of the feedback control signals in response to the sensing result signal.

10. A display device comprising:
a power managing circuit which receives an input voltage to generate a display driving voltage;
a display driving circuit which receives the display driving voltage and outputs a panel control signal; and
a display panel which receives the panel control signal to display an image,
wherein the power managing circuit includes:
a converting circuit which converts the input voltage into the display driving voltage, in response to a pulse width modulation signal generated based on converting information and outputs the display driving voltage through an output terminal;
a load sensing circuit connected to the converting circuit, wherein the load sensing circuit senses a load current of the output terminal and outputs a sensing result signal; and
a control circuit which provides the pulse width modulation signal to the converting circuit and changes the converting information based on the sensing result signal.

11. The display device of claim 10, wherein the converting circuit includes:
a first switching transistor connected between an input terminal, which receives the input voltage, and a first node; and
a second switching transistor connected between the first node and a ground terminal,
wherein the first node is connected to the output terminal, and
wherein the load sensing circuit is connected to the first node to sense the load current.

12. The display device of claim 11, wherein the first switching transistor and the second switching transistor are transistors in mutually different types, and
wherein the first switching transistor and the second switching transistor receive the pulse width modulation signal from the control circuit and are alternately turned on in response to the pulse width modulation signal.

13. The display device of claim 12, wherein the load sensing circuit includes:

a median value generating circuit which outputs, as a median load current, a median value of a first load current during a first period, in which the first switching transistor is turned on, and a second load current during a second period, in which the second switching transistor is turned on; and
a multiplier circuit which receives the median load current and the pulse width modulation signal and outputs, as the sensing result signal, a final load current generated by reflecting a duty ratio of the pulse width modulation signal to the median load current.

14. The display device of claim 11, wherein the power managing circuit further includes:
a resistance dividing circuit connected to a feedback terminal which receives a feedback voltage, and
wherein the resistance dividing circuit includes:
a first resistor connected between the feedback terminal and a dividing node; and
a second resistor connected between the dividing node and the ground terminal.

15. The display device of claim 14, further comprising:
an inductor connected between the output terminal and a second node; and
an output capacitor connected between the second node and the ground terminal, and
wherein the feedback terminal is connected to the second node.

16. The display device of claim 10, wherein the control circuit includes:
a pulse width modulating circuit which controls a duty ratio of the pulse width modulation signal, based on the converting information; and
an offset control circuit which receives the sensing result signal, and changes the converting information based on the sensing result signal.

17. An electronic device comprising:
a power managing circuit which receives an input voltage to generate a display driving voltage;
a display driving circuit which receives the display driving voltage and an image signal and output a panel control signal;
a display panel which receives the panel control signal to display an image; and
a main processor which provides the image signal to the display driving circuit,
wherein the power managing circuit includes:
a converting circuit which converts the input voltage into the display driving voltage, and outputs the display driving voltage through an output terminal;
a load sensing circuit connected to the converting circuit, wherein the load sensing circuit senses a load current of the output terminal and outputs a sensing result signal;
a resistance dividing circuit connected to a feedback terminal to receive a feedback voltage, wherein the resistance dividing circuit controls a level of the feedback voltage in response to a feedback control signal; and
a control circuit which controls an operation of the converting circuit by providing the feedback control signal to the resistance dividing circuit based on the sensing result signal.

18. The electronic device of claim 17, further comprising:
a first circuit board on which the main processor and the power managing circuit are mounted;
a second circuit board on which the display driving circuit is mounted; and a connector connected to the first circuit board and the second circuit board.

19. The electronic device of claim 18, wherein the connector includes:
a voltage pin connected between the output terminal of the power managing circuit and an input terminal of the display driving circuit.

20. The electronic device of claim 17, wherein the resistance dividing circuit includes:
a first resistor connected between the feedback terminal and a dividing node;
a second resistor connected between the dividing node and a ground terminal; and
a plurality of adjusting resistors connected to the first resistor in parallel.

* * * * *